United States Patent [19]

Ametani

[11] Patent Number: 4,732,642
[45] Date of Patent: Mar. 22, 1988

[54] APPARATUS FOR PEELING PROTECTIVE FILM OFF A THIN ARTICLE

[75] Inventor: Minoru Ametani, Takatsuki, Japan

[73] Assignee: Nitto Electric Industrial Co., Ltd., Osaka, Japan

[21] Appl. No.: 900,952

[22] Filed: Aug. 27, 1986

Related U.S. Application Data

[62] Division of Ser. No. 626,083, Jun. 29, 1984, Pat. No. 4,631,103.

[30] Foreign Application Priority Data

Apr. 10, 1984 [JP] Japan .................................. 59-72546
May 25, 1984 [JP] Japan ................................. 59-107191

[51] Int. Cl.$^4$ .......................... B32B 1/00; B32B 31/00
[52] U.S. Cl. .................................... 156/497; 156/230; 156/344; 156/539; 156/584
[58] Field of Search ............... 156/230, 234, 235, 238, 156/239, 241, 344, 584, 580, 497, 285, 286, 541, 361, 539; 269/21; 29/559, 711, DIG. 1

[56] References Cited

U.S. PATENT DOCUMENTS

| | | | |
|---|---|---|---|
| 3,785,895 | 1/1974 | Ettre et al. | 156/238 |
| 3,992,236 | 11/1976 | Wanesky | 156/235 |
| 4,029,536 | 6/1977 | Kovacs et al. | 156/285 |
| 4,066,249 | 1/1978 | Huber et al. | 269/21 |
| 4,127,436 | 11/1978 | Friel | 156/238 |
| 4,285,759 | 8/1981 | Allen et al. | 156/344 |
| 4,312,694 | 1/1982 | Sherman et al. | 156/286 |
| 4,378,264 | 3/1983 | Pilette et al. | 156/238 |

Primary Examiner—Donald E. Czaja
Assistant Examiner—Louis Falasco
Attorney, Agent, or Firm—Armstrong, Nikaido, Marmelstein & Kubovcik

[57] ABSTRACT

Apparatus for peeling a protective film off a thin article such as a silicon wafer is disclosed. The film is peeled by sticking an adhesive tape to the protective film on the article and pulling it away from the article. The protective film is peeled by the apparatus only by the adhesive force of the adhesive tape.

4 Claims, 9 Drawing Figures

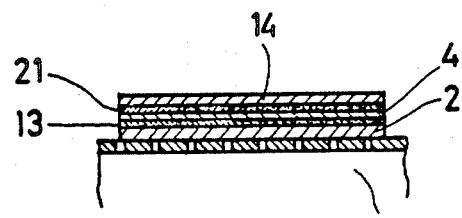
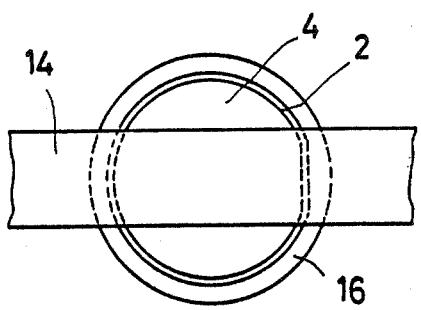
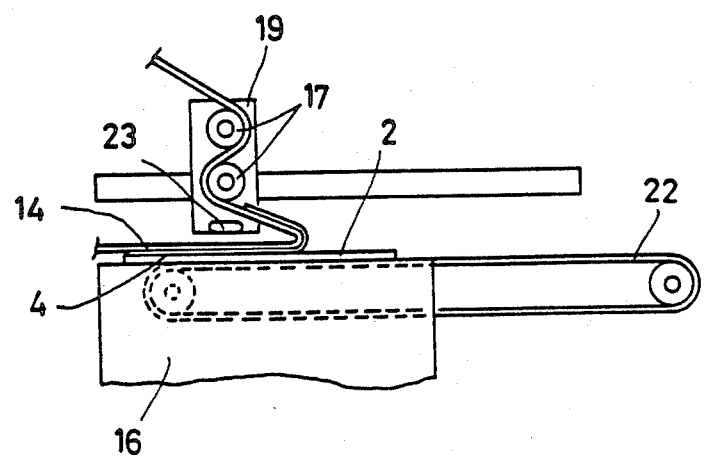
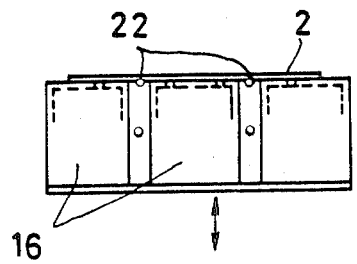

APPARATUS FOR PEELING PROTECTIVE FILM OFF A THIN ARTICLE

This is a division of application Ser. No. 626,083 filed June 29, 1984, now U.S. Pat. No. 4,631,703.

The present invention relates to a process and an apparatus for peeling an adhesive protective film stuck to one side of a thin article such as silicon wafers.

In the production of silicon wafers, a protective film is stuck to one side of the wafer for protection. After the other side of the wafer has been lapped by water flow and processed otherwise, the protective film has to be peeled. This peeling work has so far been done manually. So it was very troublesome and inefficient.

An object of the present invention is to provide a process and an apparatus for efficiently peeling a protective film off a thin article.

The process and the apparatus according to the present invention is characterised in that the protective film is peeled off the article by sticking an adhesive tape to the protective film on the article and removing the adhesive tape away from the article. The protective film is easily peeled off the article only by the adhesive force of the adhesive tape simply by moving the adhesive tape in a direction substantially parallel to the article.

In accordance with the present invention, no mechanical stress is applied to the article when peeling the protective film off the article by providing some time interval between the start of peeling and adhesive tape and the start of winding up the adhesive tape around the spindle.

Other objects and features of the present invention will become apparent from the following description taken with reference to the accompanying drawings, in which:

FIG. 6 is an enlarged vertically sectional view of an article with a protective film having an adhesive tape stuck thereto;

FIG. 7 is a plan view of the vacuum suction unit with the article mounted thereon;

FIG. 8 is a sectional front view showing another example of the suction unit and the belt conveyor; and FIG. 9 is a side view of the same;

Figure 1:
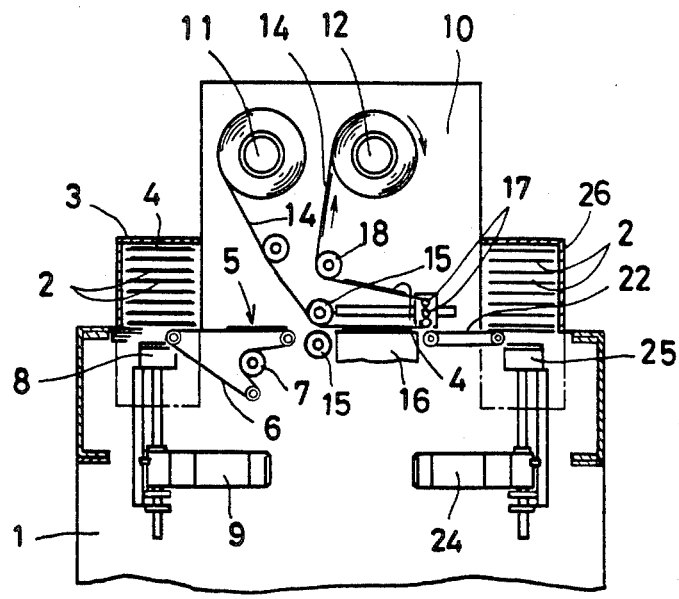
FIG. 1 is a partially sectional front view of the apparatus for carrying out the process according to the present invention.

Referring to FIG. 1 illustrating one embodiment, a machine body 1 has a magazine 3 in which a lot of thin articles 2 such as silicon wafers are stacked one upon another. A protective adhesive film 4 has been stuck to the upper side of each article 2. Means 5 for taking the articles out of the magazine comprise an endless conveyor belt 6 driven by a motor (not shown) and a driving pulley 7. A magazine support 8 is lowered at a regular pitch by an elevator 9 to put the articles 2 on the endless belt 6 one after another.

Figure 2:
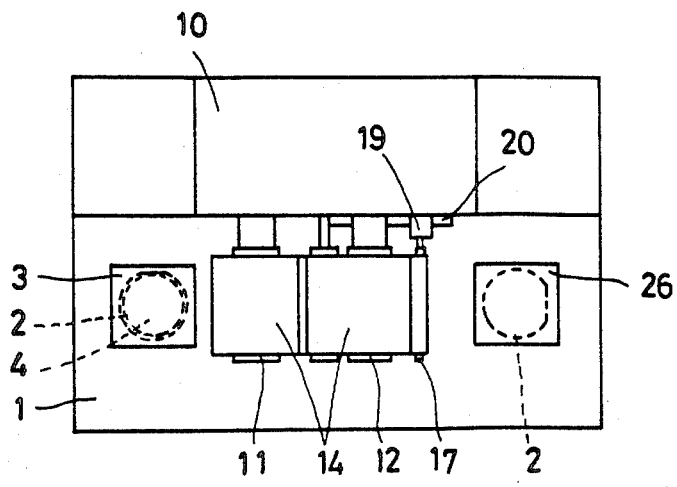
FIG. 2 is a plan view of the same.

On one side of a box 10 provided at the side of the machine body 1, a pair of spindles 11, 12 are mounted. (FIG. 2) A web of adhesive tape 14 is wound on the spindle 11, and the spindle 12 serves to take it up. The spindle 11 is provided with a brake and the spindle 12 is provided with a drive.

When the article 2 with the protective film 4 and the adhesive tape 14 passes between a pair of press rollers 15, the adhesive tape 14 with its adhesive side facing down sticks to the protective film 4 on the article 2. In front of the press rollers 15, there is a vacuum suction unit 16 which is a hollow box having a plurality of suction holes in its upper surface and connected to a vacuum pump (not shown) through a valve. (FIG. 6)

Figure 3:
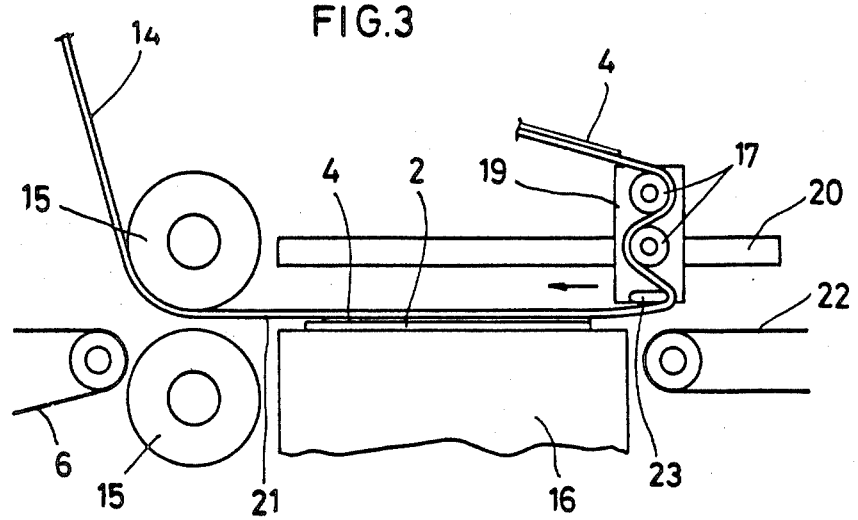
FIGS. 3-5 are enlarged front views showing how the protective film is peeled.
Figure 4:
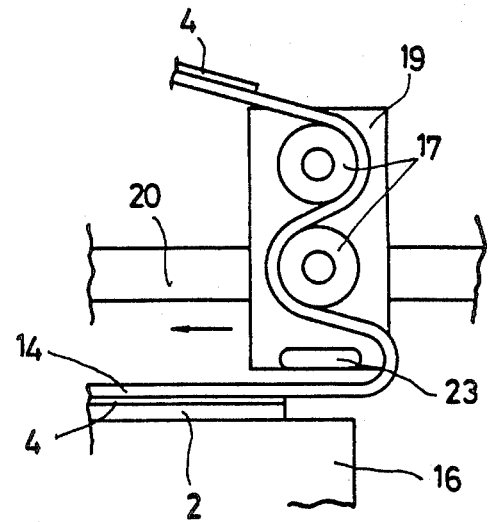
Figure 5:
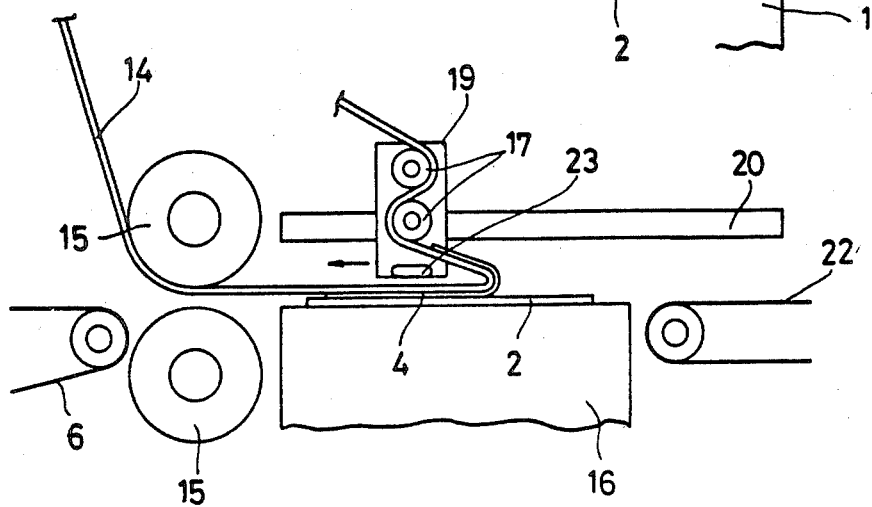

The adhesive tape 14 passes between a pair of peeling rollers 17 up and around the guide roller 18 and is taken up on the spindle 12. The peeling rollers 17 are mounted on the carriage 19 together with a tape guide 23 (FIGS. 3-5). The carriage 19 is slidably mounted on the guide rail 20 and adapted to be driven by an air cylinder or a motor-driven feed screw.

When the article 2 is taken out by the press roller 15 and comes on the suction unit 16, the spindles 11, 12 and the press rollers 5 will stop. Now, the adhesive tape 14 with its adhesive layer 21 facing down has been stuck to the protective film 4 on the article (FIG. 6).

The suction unit 16 starts to apply suction by vacuum to hold the article 2 on to the suction board 16. Then the carriage 19 starts to move in the direction of arrow in FIG. 3. Since thes pindles 11 and 12 are at standstill, the adhesive tape 14 will get loose between the roller 15 and the peeling rollers 17 (FIG. 4).

Some time after the carriage 19 has started to move, the spindle 12 starts to turn in the direction of arrow in FIG. 1 to take up the adhesive tape 14 whereas the spindle 11 is still prevented from turning by its brake. Thus, the adhesive tape 14 peels the protective film 4 off the article 2 only by its adhesive force as shown in FIG. 5 without applying any stress to the article 2. The adhesive force of the adhesive tape 14 should be stronger than that of the protective film 4.

When the protective film 4 has been almost peeled off the article, the spindle 11 is released from braking and the vacuum suction is stopped. The carriage 19 is moved in a reverse direction or forwardly while the adhesive tape 14 is taken up around the spindle 12. The article, too, will be moved in the same direction as the carriage 19 by the protective film 4 which is being peeled off the article. The article is transferred on to the next endless belt 22 whereas the protective film 4 stuck to the adhesive tape 14 is completely peeled off the article and taken up with the tape 14 around the spindle 12.

The suction unit 16 may comprise a plurality of units arranged side by side with the rear portions of the conveyor belts 22 disposed between these suction units (FIGS. 8 and 9) so that the articles 2 with the protective films 4 peeled will be carried away by the conveyor belts 22. In this case, the suction units 16 may be adapted to be lowered when the article 2 has come over the belts 22. This ensures that the article 2 will be transferred on to the belts 22.

The protective film 14 may be narrower than the width of the article 2, as shown in FIG. 7.

The articles 2 with the protective films 4 peeled are fed by the conveyor belt 22 into the next magazine 26, which is of a similar construction to the magazine 3. Each time the article 2 is inserted into the magazine 26, a support 25 driven by an elevator 24 is adapted to be raised by one pitch.

While the carriage 19 having the peeling rollers 17 is moving forwardly, the conveyor belt 6 is driven to feed the next article 2 into between the press rollers 15.

In the preferred embodiment, by repeating the above-said steps, the articles 2 are processed one after another to peel the protective film 4. The film-peeled articles 2 are contained in the magazine 26. The films 4 peeled off the articles are taken by the adhesive tape 14 which is taken up by the spindle 12. This makes it possible to peel the protective film efficiently and almost automatically.

Although in the preferred embodiments belt conveyors are used to supply the articles and to deliver the film-peeled articles, suckers or pushers may be used for this purpose.

What are claimed are:

1. An apparatus for peeling and removing a protective adhesive film having an adhesive force stuck to one side of a thin article such as a silicon wafer, comprising:

pressing/feeding means for feeding the thin article having the protective adhesive film adhered to one side thereof while pressing an adhesive tape having an adhesive force against said protective adhesive film on the article to stick it thereon;

holding means for holding in position the article having said protective adhesive film to which said adhesive tape has been adhered; and peeling means adapted to be movable in a direction substantially parallel to the thin article held in position for peeling said adhesive tape off the article to peel said protective adhesive film off the article by the adhesive force of said adhesive tape acting on said protective adhesive film, the adhesive force of said adhesive tape being larger than the adhesive force of said protective adhesive film.

2. The apparatus as claimed in claim 1, wherein said holding means comprise a vacuum suction unit.

3. The apparatus as claimed in claim 1, wherein said peeling means comprise a pair of rollers between and around which said adhesive tape runs, said rollers being adapted to move in a direction substantially parallel to the article which is being held in position.

4. The apparatus as claimed in claim 3, wherein said peeling means further comprise a spindle for taking up said adhesive tape on which said protective adhesive films have been transferred from the article.

* * * * *